US005757111A

United States Patent [19]

Sato

[11] Patent Number: 5,757,111

[45] Date of Patent: May 26, 1998

[54] NIGHT LIGHT WITH PHOSPHORESCENT ELEMENT

[76] Inventor: Giichiro Sato, 5-9, Nighi-Tsutsujigaoka 2-chome, Chofu-shi, Tokyo-to, Japan

[21] Appl. No.: 838,594

[22] Filed: Apr. 10, 1997

Related U.S. Application Data

[63] Continuation of Ser. No. 498,267, Jul. 3, 1995, abandoned.

[30] Foreign Application Priority Data

Apr. 3, 1995 [JP] Japan .................................... 7-003905
Jun. 23, 1995 [JP] Japan .................................... 7-007349

[51] Int. Cl.$^6$ ................................. H10J 5/16; F21V 9/16

[52] U.S. Cl. .......................... 313/111; 313/484; 313/578; 313/315; 362/802; 362/84

[58] Field of Search .................................... 313/110, 111, 313/484, 578, 483, 315; 362/84, 34, 802; 315/47

[56] References Cited

U.S. PATENT DOCUMENTS

| | | | |
|---|---|---|---|
| 2,702,862 | 2/1955 | Finney | 362/84 |
| 3,860,829 | 1/1975 | Fabbri | 315/86 |
| 4,343,032 | 8/1982 | Schwartz | 362/802 |
| 4,546,416 | 10/1985 | Pemberton | 362/84 |
| 4,590,543 | 5/1986 | Chen | 362/183 |
| 4,744,012 | 5/1988 | Bergkvist | 362/84 |
| 4,912,605 | 3/1990 | Whitehead | 362/84 |
| 5,079,678 | 1/1992 | Parker | 362/84 |
| 5,211,467 | 5/1993 | Seder | 362/84 |
| 5,274,536 | 12/1993 | Sato | 362/338 |
| 5,299,109 | 3/1994 | Grondal | 362/800 |
| 5,415,911 | 5/1995 | Zampa et al. | 428/40 |
| 5,502,626 | 3/1996 | Armstrong et al. | 362/84 |
| 5,607,222 | 3/1997 | Woog | 362/84 |
| 5,654,552 | 8/1997 | Toombs | 362/84 |

FOREIGN PATENT DOCUMENTS

| | | | |
|---|---|---|---|
| 54-42558 | 12/1979 | Japan | F21V 5/02 |
| 59-29284 | 8/1984 | Japan | F21S 7/00 |

*Primary Examiner*—Michael Horabik
*Assistant Examiner*—Michael Day
*Attorney, Agent, or Firm*—Lowe, Price, LeBlanc & Becker

[57] ABSTRACT

A night light includes: a light bulb (10) that produces light when excited by an electric power supply; a phosphorescent element (18) disposed near the light bulb (10) for storing light from the light bulb (10) and re-emitting the light when the light bulb (10) is turned off; and a transparent cover case (15) containing the light bulb (10) and having a face plate (16) disposed on one side of the cover case (15) wherein the phosphorescent element (18) is disposed at least on the opposite side of the cover case (15) from the face plate (16) so that light emitted from the phosphorescent element (18) illuminates the transparent cover case (15). The phosphorescent element (18) is capable of absorbing and storing light and re-emitting the light in an emergency event when the electricity is cut off so as to provide illumination for emergency evacuation.

8 Claims, 5 Drawing Sheets

NIGHT LIGHT WITH PHOSPHORESCENT ELEMENT

This application is a continuation of application Ser. No. 08/498,267 filed Jul. 3, 1995, now abandoned.

BACKGROUND OF THE INVENTION

1. Field of the Invention

The present invention relates to an electric lamp capable of emitting visible light when in the dark without relying on an electric energy from a separate power supply and, hence, particularly advantageous when used as a portable lamp for outdoor use, a flashlight, a bicycle lamp or an all-night emergency light.

2. Description of the Prior Art

As is well known, a continuous use of a flashlight, for example, or a continuous discharge of batteries set in the flashlight reduces or shortens the life of the batteries. The flashlight should, therefore, be switched off at intervals to recover the power of the batteries.

However, when the flashlight is turned off in the dark, we are momentarily deprived of sight and hence cannot visually recognize any sort of objects even the position of the flashlight. In view of this, the flashlight is sometimes continuously kept in the on-state, though it leads to a short battery life. Furthermore, in many cases, outdoor activities involving in the use of a flashlight do not require a 100% illumination intensity of the flashlight. Accordingly, a continuous lighting of the flashlight is a wasteful energy consumption.

In the case of a bicycle lamp, an electric dynamo or generator can produce a necessary level of electricity only when a wheel is rotating at speeds above a predetermined value. Since the running speed of the bicycle is not constant, night bicycle riding at low speeds would involve some risk of accident as the bicycle lamp can only produce a weak emission of light which cannot be visually distinguished from a relatively long distance.

Conventional home-use emergency lights comprise a rechargeable dry cell and a power-interruption detection switching circuit both of which are normally connected to a commercial power source so that a lamp is turned on when the electricity is cut off. The emergency lights thus arranged are normally useless and obstructive, and rather expensive.

SUMMARY OF THE INVENTION

With the foregoing drawbacks of the prior art in view, it is an object of the present invention to provide an electric lamp which is capable of absorbing and storing light emitted from an electric bulb and then emitting it to keep the desired illuminating intensity for several minutes to several hours when the light bulb is turned off in the dark or can only produce a weak emission of light.

Another object of the present invention is to provide an electric lamp which is particularly useful when embodied in a portable lamp for outdoor use, a flashlight, a bicycle lamp or an all-night emergency light.

An electric lamp of this invention for use with an electric power supply comprises an electric light bulb that produces light when excited by the electric power supply, and a phosphorescent element disposed near the light bulb, the phosphorescent element being capable of absorbing and storing light from the light bulb and then emitting it in the form of visible light when in the dark.

Preferably, the electric lamp further includes a light reflector disposed near the light bulb and having a light reflecting surface for reflecting light from the light bulb toward a desired direction, at least a portion of the light reflecting surface being composed of the phosphorescent element.

The phosphorescent element may be composed of an annular surface portion of the light reflector extending circumferentially around the light bulb, a plurality of surface portions of the light reflector arranged radially about the light bulb at angular intervals, or a plurality of pieces projecting from the light reflecting surface and arranged about the light bulb at equal angular intervals. The light reflector and the phosphorescent pieces may be integral with each other, and the phosphorescent pieces are molded of a transparent synthetic resin containing a phosphorescent pigment.

The phosphorescent element may be composed of a phosphorescent paint coated on the portion of the light reflecting surface, the phosphorescent paint being a mixture of a phosphorescent pigment and a highly transparent binding medium. As an alternative, the phosphorescent element is composed of a phosphorescent sheet attached to the portion of the light reflecting surface, the phosphorescent sheet being molded of a transparent synthetic resin containing a phosphorescent pigment. The phosphorescent element may be composed of a phosphorescent laminated sheet attached to the portion of the light reflecting surface, the phosphorescent laminated sheet including a base layer of a synthetic resin and a phosphorescent layer of a transparent synthetic resin including a phosphorescent pigment.

In a preferred embodiment, the electric lamp further includes a light reflector disposed near the light bulb and having a light reflecting surface for reflecting light from the light bulb toward a desired direction. The phosphorescent element is composed of a tubular cover disposed concentrically around the light bulb and supporting thereon the light reflector. The lamp cover is molded of a transparent synthetic resin containing a phosphorescent pigment.

In another preferred embodiment, the electric lamp further includes a transparent cover case containing therein the light bulb. The cover case has a face plate disposed on one side of the light bulb, and the phosphorescent element is disposed at least on the other side of the light bulb so that light emitted from the phosphorescent element when in the dark illuminates the transparent cover case through the face plate. The phosphorescent element may be also disposed on the outer surface of an annular side wall of the cover case. The transparent cover case further has a back plate disposed on the opposite side of the light bulb and having an inside surface confronting the face plate, the phosphorescent element extending over the inside surface. The face plate may be composed of a light scattering plate having an outer surface composed of a number of pyramidal prisms. The light bulb is preferably a transparent light bulb. The electric lamp, for used as an all-night emergency light, further includes an automatic flashing circuit electrically connected with the light bulb and adapted to be connected with the electric power supply, so as to automatically switching on and off the light bulb according to ambient illumination intensity.

The above and other objects, features and advantages of the present invention will become more apparent from the following description when making reference to the detailed description and the accompanying sheets of drawings in which preferred structural embodiments incorporating the principles of the present invention are shown by way of illustrative example.

DETAILED DESCRIPTION OF THE PREFERRED EMBODIMENTS

Figure 1:
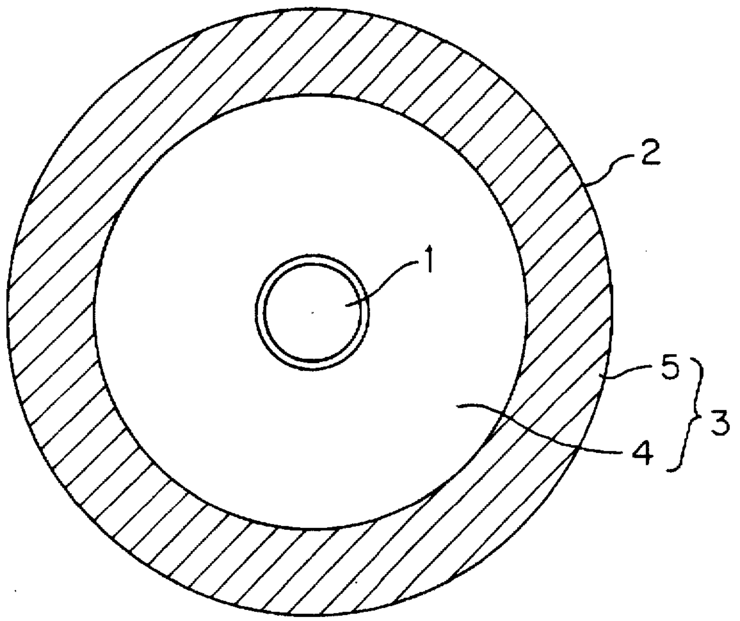
FIG. 1 is a front elevational view of an electric lamp having a light reflector according to an embodiment of the present invention.

Referring now to the drawings, wherein like reference characters designate like or corresponding parts throughout the several views, there is shown in FIG. 1 an electric lamp according to an embodiment of the present invention.

Figure 4:
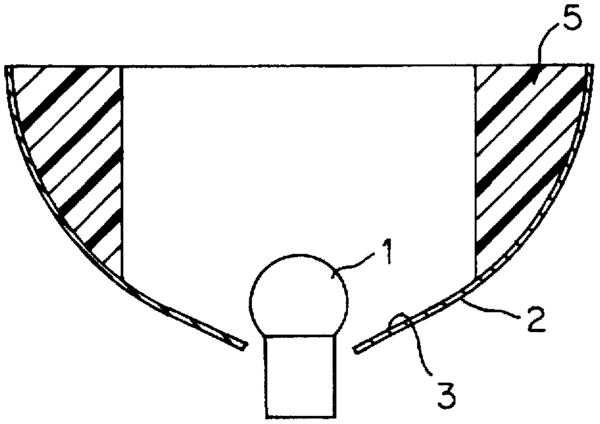
FIG. 4 is a cross-sectional view taken along line IV—IV of FIG. 3.

The electric lamp includes an electric light bulb 1 adapted to be connected with an electric power supply, such as a dry cell, a battery, an electric generator or a commercial power supply (none of them being shown), and a shade or light reflector 2 made of metal or plastics and disposed around the light bulb 1. The light reflector 2 has a generally dome-like shape, for example, such as shown in FIG. 4, and has an inside surface 3 extending circumferentially around the light bulb 1. The inside surface 3 preferably has a high reflectively and is composed of an annular central portion forming a light reflecting surface 4, and an annular peripheral portion consisting of a phosphorescent element 5 which is capable of absorbing and storing natural or artificial light and then emitting it when in the dark. The central portion of the inside surface 3 may be composed of the phosphorescent element 5 in which instance the peripheral portion forms the light reflecting surface 4. In the arrangement shown in FIG. 1, when the light bulb 1 is in the on-state, the phosphorescent element 5 absorbs and stores light emitted from the light bulb 1. And, when the light bulb 1 is turned off or can only produce a weak emission of light, the phosphorescent element 5 emits the stored radiation energy in the form of visible light, thereby illuminating a portion of the inside surface 3 of the light reflector 2.

Preferably, the phosphorescent element 5 is composed of a phosphorescent paint coated on a desired portion (peripheral portion in FIG. 1) of the reflective inside surface 3, the paint being a mixture of phosphorescent pigments and a highly transparent binding medium. The phosphorescent pigments include ones having a matrix crystal composed of $SrAl_2O_3$ or ZnSCu, manufactured and sold by Nemoto Co., Ltd. under the tradename "LumiNova", which are excited by light at a wavelength in the range of 250–400 mm and emit phosphorescent light (afterglow) at a wavelength about 520 nm for a long period of time. When illuminated at 200 Lx, the phosphorescent pigments require only a 10-minutes exciting time until an 80% saturation is reached. A 20% brightness reduction occurs only at an end of about 10 minutes afterglow of the phosphorescent pigments. The phosphorescent element 5 may be in the form of a phosphorescent sheet molded of a transparent synthetic resin containing the phosphorescent pigment. The molded phosphorescent sheet is attached to the desired portion of the reflective inside surface. The phosphorescent sheet may be of the laminated structure composed of a base layer of a synthetic resin and a phosphorescent layer of a transparent synthetic resin including the phosphorescent pigment. The base layer may be soft and flexible or rigid and inflexible in nature but it preferably has a high reflectively. In the case where the light reflector 2 is molded of a synthetic resin, the synthetic resin preferably contains 5 to 10% by weight of the phosphorescent pigment, and a portion of the inside surface of the molded light reflector 2 is formed into a light reflecting surface by applying a reflective paint layer on the back of the phosphorescent molded light reflector 2. The area ratio of the light reflecting surface 4 to the phosphorescent element 5 should by no means is limited to 1:1 but may be determined in view of the type of application or use of the electric lamp.

Figure 2:
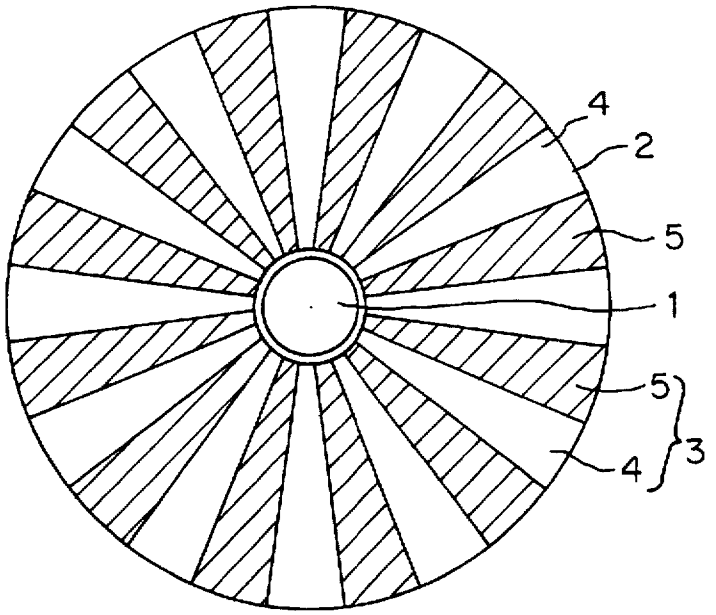
FIG. 2 is a view similar to FIG. 1, but showing an electric lamp having a modified light reflector.

FIG. 2 shows a modified form of the light reflector 2 according to the present invention. The light reflector 2 has an inside reflective surface 3 having a plurality of circumferentially equidistant surface portions extending radially outwardly from a light bulb 1 and each composed of a phosphorescent element 5. The phosphorescent elements 5 are spaced at 30 degrees, and the area ratio of the phosphorescent elements 5 to light reflecting surface 4 is 1:1. The phosphorescent element 5 may be provided in the form of a phosphorescent paint, a phosphorescent sheet or tape, or a molded portion of a phosphorescent resin, as described above with respect to the embodiment shown in FIG. 1.

Figure 3:
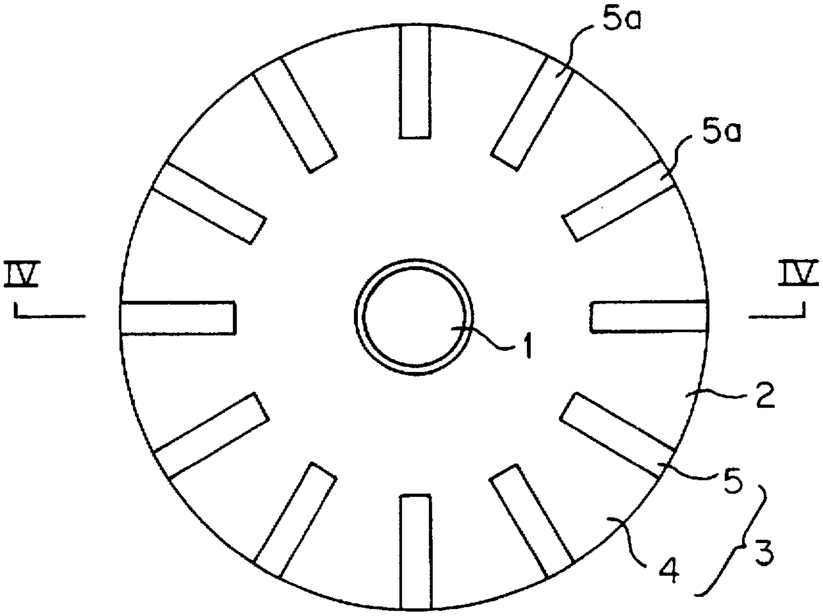
FIG. 3 is a view similar to FIG. 1, but showing an electric lamp having another modified light reflector.

A modified light reflector 2 shown in FIG. 3 differs from one shown in FIG. 2 in that the phosphorescent element 5 is composed of a plurality of circumferentially equidistant phosphorescent pieces 5*a* projecting from the light reflecting surface 3. The phosphorescent pieces 5*a* are molded of a transparent synthetic resin containing a phosphorescent pigment of the class described above. By virtue of the projecting phosphorescent pieces 5*a*, it is possible to increase the volume of the phosphorescent element 5 while maintaining a large area of the light reflecting surface 4.

Figure 5:
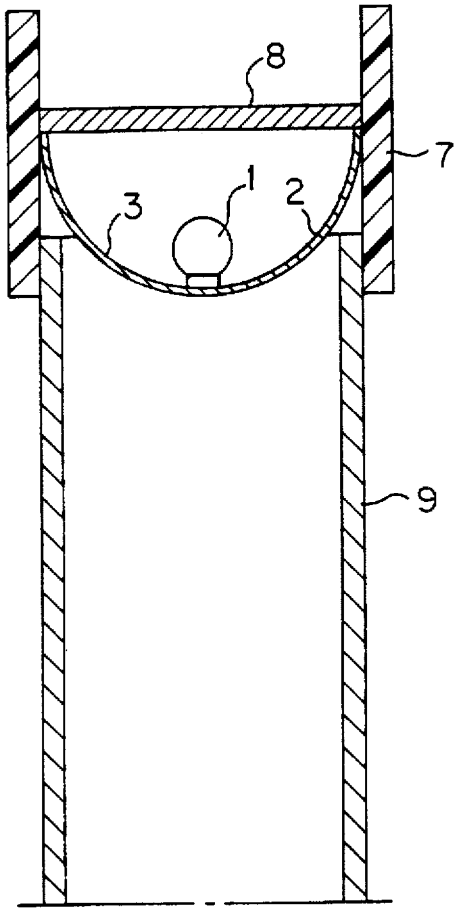
FIG. 5 is a schematic longitudinal cross-sectional view of an essential portion of an electric lamp according to another embodiment of the present invention.

FIG. 5 shows a portable lamp such as a flashlight according to another embodiment of the present invention. The flashlight includes a small light bulb 1, a light reflector 2 around the light bulb 1 and having a light reflecting surface 3 for reflecting light from the light bulb 1 toward a desired direction, a tubular cover 7 disposed concentrically around the light bulb 1 and supporting thereon the light reflector 2, a transparent face plate 8 fitted in the tubular cover 7 in front of the light bulb 1, and a cylindrical case 9 for holding therein one or more dry cells (not shown). The tubular cover 7 is molded of a transparent synthetic resin, preferably an acrylic resin, containing 10% by weight of phosphorescent pigments of the class described above. The tubular cover 7 thus forms a phosphorescent element and is able to absorb and store light of the light bulb 1 reflected from the light reflector 2.

In a field test, an outdoor lamp constructed in a manner shown in FIG. 3 and having a maximum diameter of 10 cm was hung down with its reflecting surface 4 facing downwards at a level 60 cm above a table. After the on-state of the lamp continued for 10 minutes in the dark, the light bulb 1 was turned off, whereupon the phosphorescent element 5 (i.e., the phosphorescent pieces *5a*) started emitting light with a level of brightness which was sufficient to enable a party to have a meal on the table for 6 minutes or longer. Afterglow of the phosphorescent element 5 remained visible for 5 hours or longer so that the presence of the outdoor lamp could be readily recognized even when the outdoor lamp was left alone in the field.

In an experiment using a similar lamp having a diameter of about 8 cm and attached to a bicycle lamp, it was proved that phosphorescence from the phosphorescent element 5 could be identified from a position 100 meters ahead of the bicycle without ambient light. The bicycle lamp having such phosphorescent element is therefore particularly useful as a safety means for night bicycle-riding.

Figure 6:
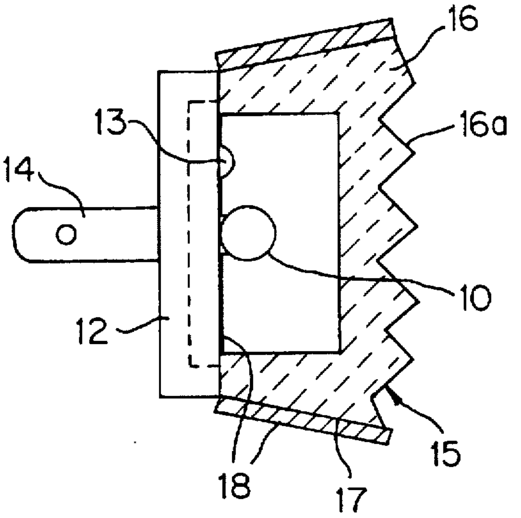
FIG. 6 is a schematic view, partly in cross section and partly in side elevation, of an electric lamp constructed as an all-night emergency light according to still another embodiment of the present invention.
Figure 8:
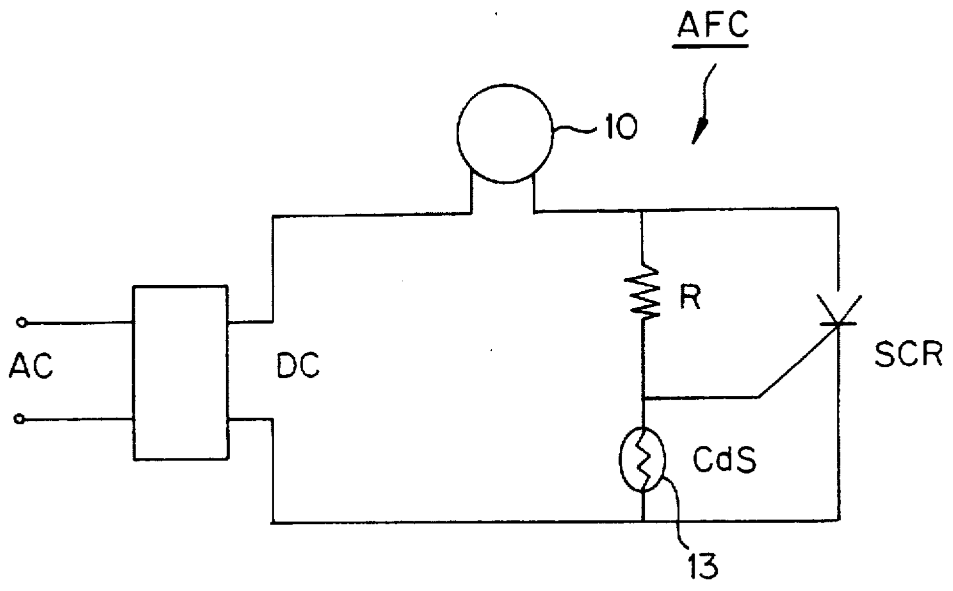
FIG. 8 is a circuit diagram showing an automatic flashing circuit incorporated in the all-night emergency light shown in FIG. 7 or 8.

FIG. 6 shows an all-night emergency light embodying the electric lamp of the present invention. The all-night emergency light includes a small light bulb 10, such as a transparent incandescent bulb or a neon bulb, a back plate 12 disposed behind the light bulb 10 and having an automatic flashing circuit AFC of a simple construction such as shown in FIG. 8, a photoelectric transducer 13 such as a CdS mounted on the back plate 12 and electrically incorporated in the automatic flashing circuit AFC together with the light bulb 10, and blades 14 electrically connected with the automatic flashing circuit AFC, the blades 14 being assembled with the back plate 12 to form a plug unit. The blades 14 of the plug unit are normally connected with a commercial power supply. The light bulb 10 is automatically turned on and off by the automatic flashing circuit AFC depending on an intensity of ambient light detected by the photoelectric transducer (CdS) 13. More specifically, the light bulb 10 is turned on when the level of ambient light falls below a predetermined threshold value. Conversely, when the level of ambient light exceeds the predetermined threshold value, the light bulb is turned off.

The all-night emergency light further includes a cover case 15 molded of a transparent synthetic resin and attached to the back plate 12 of the plug unit so that the light bulb 10 is contained in the cover case 15. The cover case 15 includes a face plate 16 having an outer surface composed of a number of pyramidal prisms *16a*. The face plate 16 thus constructed forms a light scattering plate so that the light bulb 10 and parts of the automatic flashing circuit AFC contained in the cover case 15 cannot be visually observed through the face place 16 when the light bulb 10 is in the off-state. When the light bulb stays lit, the transparent face plate 16 does not absorb light and, by virtue of a plurality of luminescent spots formed by the pyramidal prisms, the face plate 16 can produce an emission of light of a particular texture. Typical examples of the face plate 16 are disclosed in Japanese Utility Model Publications Nos. 54-42558 and 59-29284. The cover case 15 also includes an annular side wall 17 extending around the light bulb 10.

The all-night emergency light further includes a phosphorescent element 18 disposed on an inside surface the back plate 12 and an outer surface of the side wall 17 either over the entire area of, or over a part of, each of these surfaces. The phosphorescent element 18 contains phosphorescent pigments of the class described above with respect to the embodiments shown in FIGS. 1–5 and is capable of absorbing and storing natural light or light from the light bulb 10 and then emitting it in the form of visible light when the electricity is cut off in the night. In order to provide a sufficient time period for emergency evacuation, it is preferable that phosphorescence (afterglow) of the phosphorescent element 18 remains visible for 5–10 minutes and has a sufficient level of brightness to illuminate in and around the emergency light. The phosphorescent element 18 is preferably provided in the form of a phosphorescent paint layer or a phosphorescent tape or sheet.

In use of the all-night emergency light, during the daytime and when the light bulb 10 stays lit in the night, the phosphorescent element 18 absorbs and stores natural light and light from the light bulb 10. In the case of an interruption of power supply occurred in the night, the light bulb 10 is turned off, whereupon the phosphorescent element 18 starts emitting stored radiant energy in the form of visible light. The emitted light passes through an interior space of the cover case 15 and through the face plate 16 where it is scattered to thereby illuminate in and abound the cover case 15. In this instance, if the light bulb 10 is composed of a transparent bulb, the light emitted from the phosphorescent element 18 passes through the light bulb 10 and illuminate the cover case 15 without forming a silhouette of the light bulb 10 so that all of the radiant energy of the phosphorescent element 18 can be utilized as illuminating light.

Figure 7:
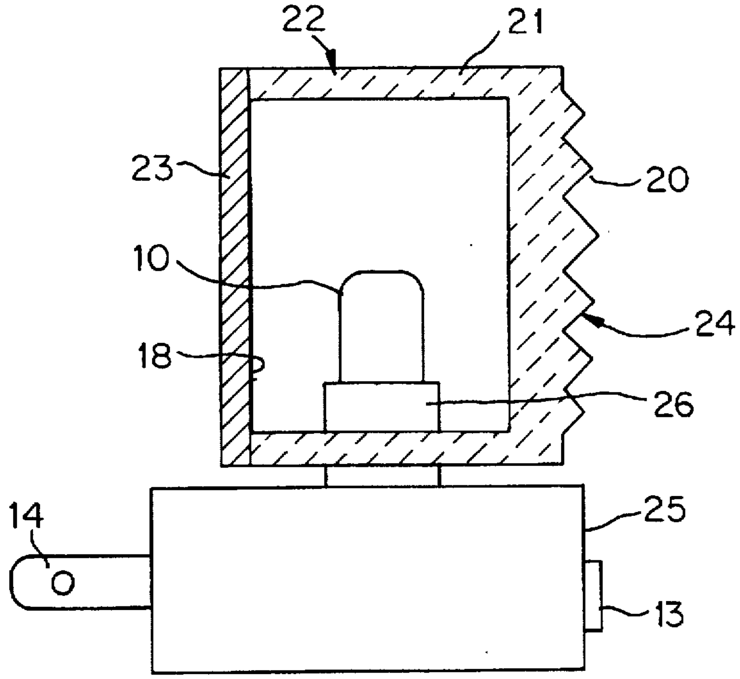
FIG. 7 is a view similar to FIG. 6, but showing a modified form of the all-night emergency light according to another embodiment of the present invention.

A modified all-night emergency light shown in FIG. 7 includes a two-piece cover case 24 composed of a box-like cover case body 22 having an open side, and a back plate 23 attached to the cover case body 22 to close the open side of the same, with a small light bulb 10 contained in the cover case 24. The cover case body 22 is molded of a transparent synthetic resin and has a face plate 20 confronting the back plate 23 with the light bulb 10 disposed centrally therebetween. The face plate 20 has an outside surface composed of a number of pyramidal prisms and hence forms a light scattering face plate. The back plate 23 has an inside surface confronting the inside surface of the face plate 20 and carrying thereon a phosphorescent element 18 of the same class as one shown in FIG. 6. The phosphorescent element 18 may be composed of a phosphorescent paint, a phosphorescent tape or sheet, or a synthetic resin containing a phosphorescent pigment and molded into the back plate 23. The cover case 24 is attached to a plug unit composed of a base 25 and a pair of blades 14. The blades 14 are normally connected with a commercial power supply, and the base 25 houses therein an automatic flashing circuit AFC, such as shown in FIG. 8, having a photoelectric transducer 13 such as a CdS attached to an outside surface of the base 25. The plug unit is also provided with a socket 26 projecting into the cover case 24 through a side wall 21 for receiving therein the light bulb 10. The socket 26 may project through the back plate 23 into the cover case 24.

The all-night emergency light of the foregoing construction operates in the same manner as one shown in FIG. 6 and no further description is needed.

The face plate 16; 20 of the cover case 15; 24 always forms a luminous surface regardless of whether the light bulb 10 stays lit in the night, or it is turned down in the night due to an interruption of electric power supply. Accordingly, when the electricity is cut off in the night, the user can readily recognize the position of the emergency light wile being lit by phosphorescence of the phosphorescent element 18 and then take necessary actions for emergency evacuation using light of the emergency light. Since illumination in an emergency can be obtained without relying upon an electric energy from a separate power supply, the all-night emergency light is free from an operation failure, such as accidental shorts or burning, even when it is submerged by sprinklers. The all-night emergency light of this invention is, therefore, highly safe in operation. Furthermore, the all-night emergency light is compact and lightweight and hence can readily be set at any desired position.

Obviously, various minor changes and modifications of the present invention are possible in the light of the above teaching. It is therefore to be understood that within the scope of the appended claims the invention may be practiced otherwise than as specifically described.

What is claimed is:

1. A night light for use with an electric power supply, comprising:

an electric light bulb that produces light when excited by the electric power supply;

a phosphorescent element disposed near said light bulb and capable of absorbing and storing light from said light bulb and then emitting it in the form of visible light when said light bulb is turned off in the dark or can only produce a weak emission of light; and a transparent cover case containing therein said light bulb, wherein said cover case has a face plate disposed on one side of said cover case, and said phosphorescent element is disposed at least on the opposite side of said cover case from said face plate so that light emitted from said phosphorescent element illuminates said transparent cover case.

2. A night light according to claim 1, wherein said transparent cover case further has an annular side wall extending around said light bulb, said phosphorescent element is also disposed on an outer surface of said annular side wall.

3. A night light according to claim 1, wherein said transparent cover case further has a back plate disposed on said opposite side of said cover case and having an inside surface confronting said face plate, said phosphorescent element extending over said inside surface.

4. A night light according to claim 1, wherein said face plate is composed of a light scattering plate having an outer surface composed of a number of pyramidal prisms.

5. A night light according to claim 4, wherein said light bulb is a transparent light bulb.

6. A night light according to claim 1, for used as an all-night emergency light, further including an automatic flashing circuit electrically connected with said light bulb and adapted to be connected with the electric power supply, so as to automatically switching on and off said light bulb according to ambient illumination intensity.

7. A night light according to claim 6, further including a plug unit adapted to be connected to the electric power supply and containing therein said automatic flashing circuit, said plug unit being attached to said cover case.

8. A night light according to claim 7, wherein said plug unit has a portion confronting said face plate and carrying thereon said phosphorescent element.

* * * * *